United States Patent [19]

Takata

[11] Patent Number: 4,651,304
[45] Date of Patent: Mar. 17, 1987

[54] EPROM MEMORY DEVICE HAVING A TEST CIRCUIT

[75] Inventor: Akira Takata, Toyonaka, Japan

[73] Assignee: Ricoh Company, Ltd., Tokyo, Japan

[21] Appl. No.: 559,320

[22] Filed: Dec. 8, 1983

[30] Foreign Application Priority Data

Dec. 9, 1982 [JP] Japan .................................. 57-216346

[51] Int. Cl.[4] .............................................. G11C 7/00
[52] U.S. Cl. ...................................... 365/201; 365/230
[58] Field of Search .................... 365/201, 230; 371/21

[56] References Cited

U.S. PATENT DOCUMENTS

| 4,055,754 | 10/1977 | Chesley | 365/201 |
| 4,342,103 | 7/1982 | Higuchi et al. | 365/201 |
| 4,422,161 | 12/1983 | Kressel et al. | 365/200 |
| 4,603,405 | 7/1986 | Michael | 365/201 |

Primary Examiner—James W. Moffitt
Attorney, Agent, or Firm—Cooper, Dunham, Griffin & Moran

[57] ABSTRACT

An EPROM memory device includes a plurality of reprogrammable memory cells arranged in the form of a matrix and a test circuit capable of having two or more memory cells selected for operation at the same time during the test mode, to thereby reduce the required testing time significantly.

7 Claims, 6 Drawing Figures

PRIOR ART FIG. 1
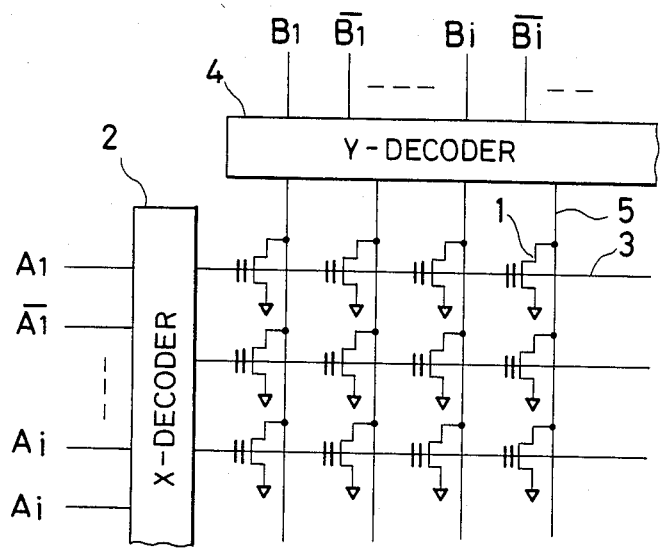
FIG. 2
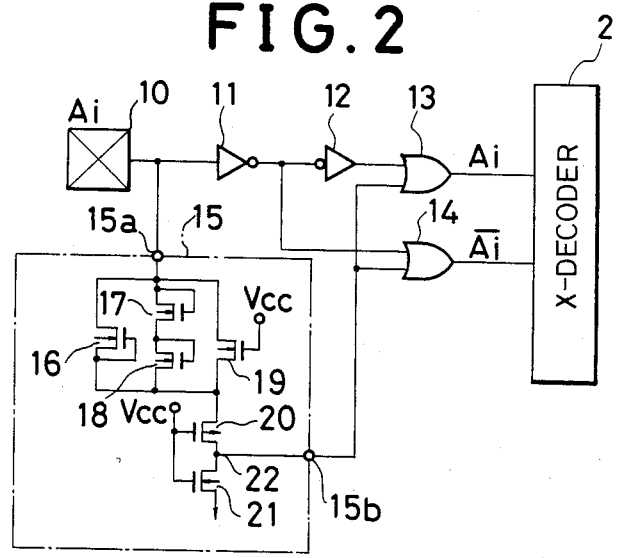

4,651,304

EPROM MEMORY DEVICE HAVING A TEST CIRCUIT

BACKGROUND OF THE INVENTION

1. Field of the Invention

This invention relates to a semiconductor memory device having reprogrammable memory cells, and particularly to an EPROM (Erasable Programmable Read Only Memory) device having a test circuit for testing each of the memory cells.

2. Description of the Prior Art

As shown in FIG. 1, an EPROM memory device includes a plurality of reprogrammable cells 1, i.e., stacked-gate or double gate memory transistors in the illustrated example, arranged in the form of a matrix having rows and columns. As shown, each of the memory transistors is provided at the intersection between the corresponding column and row. Customarily, during the test mode, the memory cells are tested for read and write operations one by one just like during the ordinary use mode. That is, one of word lines 3 is selected by an address signal $A_1-A_n$ through an X-decoder 2, and at the same time one of bit lines 5 is selected by another address signal $B_1-B_m$ through a Y-decoder 4, thereby selecting the memory cell 1 located at the intersection of the thus selected word and bit lines for read/write operation.

However, in the case of an EPROM, the programming time required to program a single cell is rather long and in the order of 50 milliseconds. Thus, in accordance with the test scheme in which the write-in and read out operation is to be carried out one cell at a time, an unacceptably long period of time is required. For this reason, although there has been proposed a method for shortening the programming time per cell in the wafer test, the increase in test time for EPROM devices is becoming more and more serious as the memory capacity increases.

SUMMARY OF THE INVENTION

Therefore, it is an object of the present invention to provide a semiconductor memory device which may be tested very efficiently in a short period of time.

Another object of the present invention is to provide an EPROM device having a test circuit capable of testing each cell of the device speedily as compared with the prior art.

A further object of the present invention is to provide a reprogrammable semiconductor memory device having an internal test circuit.

Other objects, advantages and novel features of the present invention will become apparent from the following detailed description of the invention when considered in conjunction with the accompanying drawings.

BRIEF DESCRIPTION OF THE DRAWINGS

FIG. 1 is a schematic illustration showing the overall structure of an EPROM device to which the present invention may be applied;

FIG. 2 is a circuit diagram partly in logic symbols showing the test circuit for testing the memory cells of an EPROM device constructed in accordance with one embodiment of the present invention;

DESCRIPTION OF THE PREFERRED EMBODIMENTS

Figure 3:
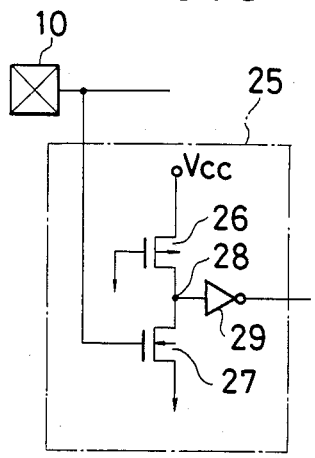
FIGS. 3 and 4 are circuit diagrams also partly in logic symbols showing other embodiments of the present invention.

Referring now to FIG. 2, a test circuit of the present invention is provided generally between an input pad 10 for receiving an address signal $A_i$ and the X-decoder 2 which is connected to each of the word lines 3. Thus, generally, when the address signal $A_i$ is applied to the pad 10, the signal $A_i$ and its inverted signal $\overline{A}_i$ are applied to the decoder 2. That is, the address signal $A_i$ applied to the pad 10, on one hand, is supplied to the decoder 2 through a pair of series connected inverters 11 and 12 and an OR gate 13. On the other hand, the address signal $A_i$ is supplied to the decoder 2 as inverted after passing through the inverter 11 and another OR gate 14. In the present embodiment, a high voltage detecting circuit 15 is connected to receive as its input the address signal $A_i$ applied to the input pad 10 and is connected to supply its output to one input of each of the OR gates 13 and 14.

As will be described fully later, the high voltage detecting circuit 15 functions such that it supplies an output at high level when its input, i.e., address signal $A_i$, is equal to or higher than a predetermined voltage level and on the other hand it supplies an output at low level when its input is lower than the predetermined voltage level. In the illustrated structure of the high voltage detecting circuit 15, the input signal $A_i$ is applied to a load circuit, comprised of N-channel MOSFETs 16 through 19, whose output is connected to the source of a P-channel MOSFET 20 which is connected to another N-channel MOSFET to form a CMOS structure. MOSFETs 20 and 21 have their gates commonly connected to a supply voltage $V_{cc}$, and a node 22 at the interconnection between these transistors supplies an output of the high voltage detecting circuit 15.

If a high voltage (for example, 10 V or more) is inputted to the high voltage detecting circuit 15 so that the voltage supplied to the source of MOSFET 20 after a voltage drop by the load circuit of MOSFETs 16–19 is equal to or larger than $V_{cc}+V_{TH}$ (threshold voltage of MOSFET 20), then both of MOSFETs 20 and 21 are turned on with the node 22 providing a high level output determined by the ratio of conductive resistances of these two transistors. On the other hand, if the input signal applied to the high voltage detecting circuit 15 is relatively lower in voltage such that the voltage supplied to the source of MOSFET 20 is lower than the value of $V_{cc}+V_{TH}$, then MOSFET 20 is turned off and MOSFET 21 is turned on with the node 22 providing a low level output.

In operation, during the test mode, a high voltage is applied to the pad 10. Under the condition, the OR gate 13 receives a high input signal as its one input as supplied through the series connected inverters 11 and 12 and the OR gate 14 receives a low input signal as its one input as supplied through the inverter 11; however, since each of the OR gates 13 and 14 receives a high level signal as the remaining input signal, both of the address input signals $A_i$ and $\overline{A}_i$ supplied to the X-decoder 2 are at high level. As a result, two of the word lines 3 are selected at the same time by the X-decoder 2. Accordingly, under the condition, if one of the bit lines 5 is selected by the Y-decoder 4, two of the memory cells 1 arranged in the form of a matrix may be programmed or read out at the same time, to thereby reduce the test time to a half.

Regarding the other address signals, if their respective circuits are similarly structured, such that the address input signal and its inverted signal may be set at high level at the same time depending upon the condition of the output signal from the high voltage detecting circuit, the number of memory cells which are operated, i.e., programmed or read out, at the same time may be increased correspondingly. Furthermore, the device can be structured to operate three or more memory cells at the same time in accordance with the teachings of the present invention, to thereby reduce the test time period correspondingly. However, it is true that the number of memory cells which may be programmed and read out at the same time is limited by the allowable power level of a particular memory device since the level of power consumption also increases.

It is to be noted that in the case of an EPROM memory device, since a programmed cell becomes the cut-off condition, the read out test for a plurality of memory cells may be carried out at the same time. Stated more in detail, if a plurality of memory cells selected for read out mode are properly programmed, no sense current will flow through any of these cells; on the other hand, if any one of these memory cells is not properly programmed, there will be a flow of sense current. As a test mode to be used in connection with the embodiment having the above-described structure, it is most preferable to carry out programming for all of the memory cells. On the other hand, in the case when an address signal $V_{IL}$ or $V_{IH}$ in the mode of ordinary operation is applied to the pad 10, the output signal from the high voltage detecting circuit 15 is always kept at low level, so that the ordinary decoding operation of programming and reading out is carried out.

In the present embodiment, since a signal supplied from the inverter 12 to the OR gate 13 is rendered high level when a high input voltage is applied to the pad 10, the OR gate 13 may be omitted, if desired. In this case, an output signal from the high voltage detecting circuit 15 is supplied only to the OR gate 14.

It is to be noted that the high voltage detecting circuit 15 should not be structurally limited only to the one shown in FIG. 2 and it may take various other forms. One such example is shown in FIG. 3. In this example, an alternate high voltage detecting circuit 25 includes a P-channel MOSFET 26 as a load and an N-channel MOSFET 27 which is connected to MOSFET 26 to form a CMOS structure and which has a high predetermined threshold voltage (e.g., $V_{TH}=25$ V). It is so structured that an input signal is applied to the gate of MOSFET 27 and the voltage at the node 28 between MOSFETs 26 and 27 is supplied as an output signal through an inverter 29. In this case, during the test mode in which a high voltage is applied to the pad 10, both of the transistors 26 and 27 are turned on thereby causing the node 28 to be low level, so that the output from this high voltage detecting circuit 15 becomes high level. As a result, both of address input signals $A_i$ and $\overline{A}_i$ to the X-decoder 2 become high level at the same time. On the other hand, while the signal at the pad 10 is an ordinary address signal such as $V_{IL}$ and $V_{IH}$, MOSFET 27 is turned off, which then causes the node 28 to be high level through MOSFET 26. Thus, the output signal from this high voltage detecting circuit 25 becomes low level thereby allowing for the decoder 2 to carry out the ordinary decoding operation.

The high voltage detecting circuits 15 and 25 described above each have a CMOS structure, but the high voltage detecting circuit may also be structured to use other types of transistors such as N-channel MOSFET. Moreover, in the above-described embodiments, the high voltage detecting circuit is provided at the input side of X-decoder 2; however, it may also be provided at the input side of Y-decoder 4.

Alternatively, the high voltage detecting circuit 15 may be substituted by a test pad which is provided as connected to one input of each of the OR gates 13 and 14. Such a test pad is not connected to the input pad 10 and connected to receive a high level signal during the test mode. In this case, such a test pad is preferably kept pulled down to ground during the ordinary operational mode thereby preventing the device from accidentally entering into the test mode.

Figure 4:
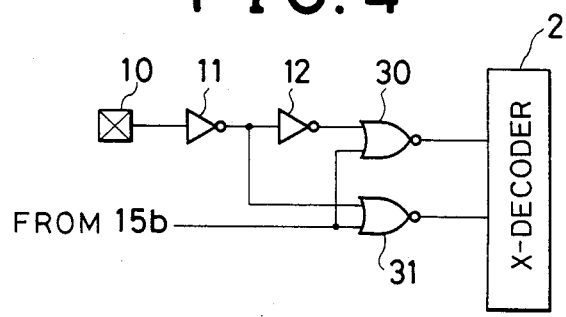

It should further be noted that after having all of the memory cells in the structure of FIG. 1 programmed, stress test may be carried out by setting all of the word lines 3 at low level and all of the bit lines 5 at high level thereby applying stress to all of the memory cells. In this case, in response to the fact that the output signal from the high voltage detecting circuit is high level, all of the bit lines 5 are rendered into the selected state through the Y-decoder 4. Moreover, the OR gates 13 and 14 provided as connected at the input side of X-decoder 2 should be changed to NOR gates 30 and 31 as shown in FIG. 4, whereby setting one word line 3 at the non-selected state will cause all of the word lines 3 to be set at the non-selected state. It is to be noted that such a high voltage detecting circuit may be provided at the input side of either of the X and Y decoders.

Figure 5:
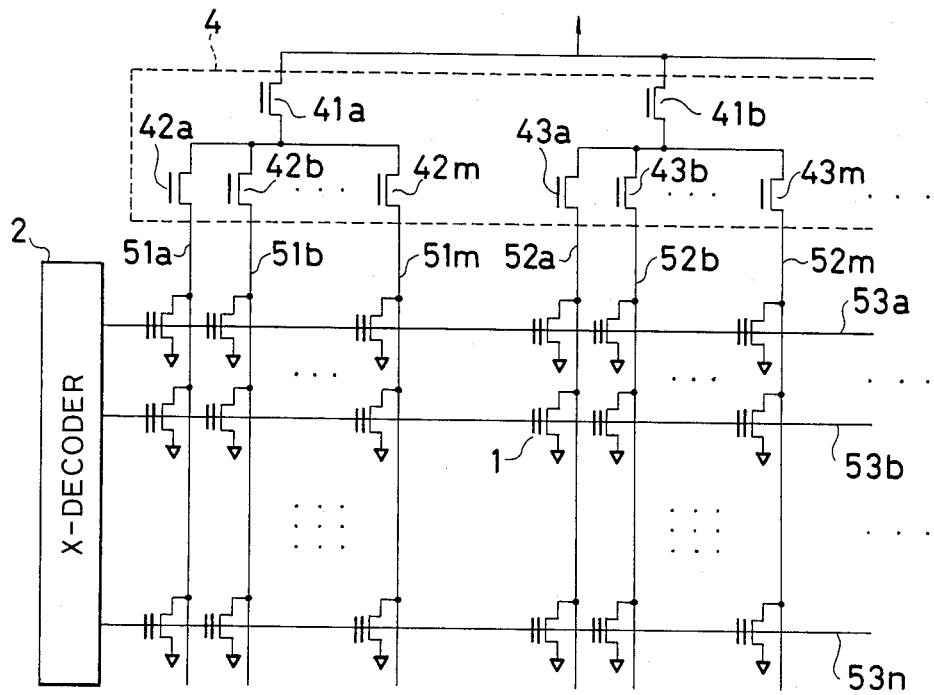
FIG. 5 is a schematic illustration showing the structure of an EPROM device with more details in the Y-decoder constructed in accordance with another embodiment of the present invention.

FIG. 5 shows another embodiment of the present invention in which the Y-decoder 4 includes four first stage gates, only two (41a and 41b) of which are shown in FIG. 5 and each of which is commonly connected to m second stage gates, e.g., 42a–42m for 41a and 43a–43m for 41b. Each of the second stage gates is connected to its unique bit line so that gates 42a–42m are connected to bit lines 51a–51m, respectively, and gates 43a–43m are connected to bit lines 52a–52m, respectively. In the present embodiment, there are 4 times m number of bit lines connected to the Y-decoder 4. Although the present invention should not be limited thereto, the particular structure shown in FIG. 5 includes 256 word lines 53a–53n. Similarly with the previous embodiment, a reprogrammable memory cell 1, i.e., SAMOS (Stacked-gate MOS) in the illustrated example, is provided at each intersection between the word and bit lines which run perpendicularly to each other. In accordance with the present invention, two of the first stage gates in the Y-decoder 4, are selected and thus turned on at the same time. For example, in the structure of FIG. 5, the first stage gates 41a and 41b are turned on at the same time and programming/read out is carried out at the same time for the memory cells located at the intersections between word line 53a and bit line 51a and 52a. Similarly, the other memory cells may be operated two at a time, to thereby reduce the test time by a half.

When a stress test is to be carried out in the device of FIG. 5, all of the gates in the Y-decoder 4 are turned on with all of the word lines connected to ground. In this case, all of the memory cells 1 receive at their sources a voltage (approximately 12 V) same as the one applied during programming with their gates connected to ground. This test is conducted after programming all of the cells to check whether or not the accumulated charge leaks away during programming other cells.

Figure 6:
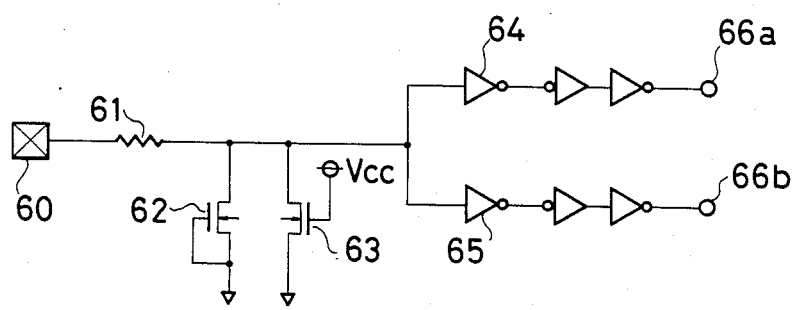
FIG. 6 is a circuit diagram partly in logic symbols showing the test circuit which may be suitably incorporated into the structure of FIG. 5.

FIG. 6 shows a test circuit which may be advantageously incorporated into the structure of FIG. 5 to change its test mode as described above. As shown, this circuit includes a test pad 60 which is adapted to receive an input signal at three different levels. The test pad 60 is connected to a pair of inverters 64 and 65 through a resistor 61. Also provided as connected to the node between the resistor 61 and the pair of inverters 64 and 65 are a gate protection diode 62 and a pull down transistor 63, whose gate is connected to receive supply voltage $V_{cc}$. The inverters 64 and 65 are connected to output terminals 66a and 66b, respectively, through a pair of series connected inverters. It is to be noted that the output terminals 66a and 66b may be connected appropriately to the transistors in the Y-decoder 4 by those skilled in the art to effect the above-described test mode.

The input signal applied to the test pad 60 may vary at three levels, e.g., low level, first high level of 2.5 V and second high level of 5.0 V. It should be noted that the inverters 64 and 65 have the inverting threshold voltages 1.25 V and 3.75 V, respectively. Thus, when the input signal at the test pad 60 is low level, the conditions at the output terminals 66a and 66b are both set at high level by the pull down transistor 63. If the input signal at the test pad 60 is changed to the first high level of 2.5 V, then the condition at the output terminal 66a becomes low level and the condition at the output terminal 66b remains at high level. On the other hand, if the input signal of second high level at 5 V is applied to the test pad 60, the low level condition is established for each of the output terminals 66a and 66b. Accordingly, just by changing the level of the input voltage applied to the test pad 60, the dual test mode as described before may be implemented easily.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. An EPROM device having a standard mode and a test mode, comprising:
   a plurality of reprogrammable memory cells arranged in the form of a matrix;
   first decoding means adapted to receive a first address signal and connected to row lines of said matrix;
   second decoding means adapted to receive a second address signal and connected to column lines of said matrix;
   selection control means connected to either one of said first and second decoding means for controlling such that a predetermined number of two or more of said row or column lines are selected for operation at the same time when said device is in said test mode, said selection control means including at least one test pad to which a test signal is applied, at least a pair of output terminals which are connected to the corresponding one of said first and second decoding means, a first inverter having a first threshold level and connected between said test pad and one of said pair of output terminals, a second inverter having a second threshold level, which is different from said first threshold level, connected between said interconnection and the other of said pair of output terminals, and a MOSFET connected between an interconnection between said test pad and said first inverter and a first reference potential and having its gate connected to a second reference potential which is different from said first reference potential; and
   write/read means for writing information into or reading information from those memory cells located at the selected row and column lines.

2. A device of claim 1 wherein said test input signal is varied at least at three levels including a first level which is smaller than both of said first and second threshold levels, a second level which is in a range between said first and second threshold levels and a third level which is larger than both of said first and second threshold levels.

3. A device of claim 1 wherein said first and second threshold levels are set between said first and second reference potentials.

4. A device of claim 3 wherein said first reference potential is ground and said second reference potential is a supply potential.

5. A device of claim 4 wherein said supply potential is positive and said MOSFET is a pull-down transistor.

6. A device of claim 4 wherein said selection means further comprises a resistor connected between said test pad and said interconnection.

7. A device of claim 6 wherein said selection means further comprises a gate protection diode connected between said interconnection and ground.

* * * * *